United States Patent
Nishihara et al.

(10) Patent No.: US 8,841,819 B2
(45) Date of Patent: Sep. 23, 2014

(54) ACOUSTIC WAVE DEVICE

(75) Inventors: Tokihiro Nishihara, Tokyo (JP); Shinji Taniguchi, Tokyo (JP); Tsuyoshi Yokoyama, Tokyo (JP); Takeshi Sakashita, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 450 days.

(21) Appl. No.: 13/240,407

(22) Filed: Sep. 22, 2011

(65) Prior Publication Data
US 2012/0104900 A1 May 3, 2012

(30) Foreign Application Priority Data

Nov. 1, 2010 (JP) ................................ 2010-245452

(51) Int. Cl.
*H03H 9/54* (2006.01)
*H01L 41/09* (2006.01)
*H03H 9/58* (2006.01)

(52) U.S. Cl.
CPC ............... *H03H 9/584* (2013.01); *H03H 9/589* (2013.01); *H03H 9/587* (2013.01)
USPC ............ 310/320; 310/324; 310/366; 333/187

(58) Field of Classification Search
USPC .................. 310/320, 324, 366; 333/186–189
See application file for complete search history.

(56) References Cited

U.S. PATENT DOCUMENTS

| 3,174,122 | A | * | 3/1965 | Fowler et al. | 333/189 |
| 3,321,648 | A | * | 5/1967 | Kolm | 310/321 |
| 4,765,919 | A | * | 8/1988 | Tomita et al. | 252/62.9 PZ |
| 6,231,779 | B1 | * | 5/2001 | Chiang et al. | 252/62.9 R |
| 7,091,649 | B2 | * | 8/2006 | Larson et al. | 310/324 |
| 7,424,772 | B2 | * | 9/2008 | Larson, III | 29/25.35 |
| 7,425,787 | B2 | * | 9/2008 | Larson, III | 310/311 |
| 7,612,636 | B2 | * | 11/2009 | Jamneala et al. | 333/189 |
| 7,675,390 | B2 | * | 3/2010 | Larson, III | 333/189 |
| 7,737,807 | B2 | * | 6/2010 | Larson et al. | 333/189 |
| 7,758,979 | B2 | * | 7/2010 | Akiyama et al. | 428/699 |

(Continued)

FOREIGN PATENT DOCUMENTS

| CN | 1805276 A | 7/2006 |
| CN | 1953435 A | 4/2007 |

(Continued)

OTHER PUBLICATIONS

Gilbert et al., "Improved Coupled Resonator Filter Performance using a Carbon-Doped Oxide De-Coupling Layer", IEEE International Ultrasonics Symposium Proceedings, 2009, pp. 867-871.

(Continued)

*Primary Examiner* — Thomas Dougherty
(74) *Attorney, Agent, or Firm* — Chen Yoshimura LLP

(57) ABSTRACT

An acoustic wave device includes: a first piezoelectric thin film resonator including a first lower electrode, a first upper electrode and a first piezoelectric film sandwiched between the first lower and upper electrodes; a decoupler film provided on the first upper electrode; and a second piezoelectric thin film resonator provided on the decoupler film and including a second lower electrode, a second upper electrode and a second piezoelectric film sandwiched between the second lower and upper electrodes, wherein the first piezoelectric film and the second piezoelectric film comprise aluminum nitride and include an element increasing a piezoelectric constant of the aluminum nitride.

10 Claims, 21 Drawing Sheets

(56) References Cited

U.S. PATENT DOCUMENTS

| | | | |
|---|---|---|---|
| 7,855,618 B2 * | 12/2010 | Frank et al. ............... 333/187 |
| 2005/0093653 A1 | 5/2005 | Larson, III |
| 2005/0093654 A1 | 5/2005 | Larson, III et al. |
| 2005/0231072 A1 | 10/2005 | Inoue et al. |
| 2006/0114080 A1 | 6/2006 | Larson, III |
| 2006/0152110 A1 | 7/2006 | Taniguchi et al. |
| 2006/0164183 A1 | 7/2006 | Tikka et al. |
| 2007/0085631 A1 | 4/2007 | Larson, III et al. |
| 2007/0120625 A1 * | 5/2007 | Larson et al. ............... 333/189 |
| 2007/0252476 A1 | 11/2007 | Iwaki et al. |
| 2010/0117762 A1 | 5/2010 | Taniguchi et al. |
| 2011/0267155 A1 | 11/2011 | Hara et al. |
| 2013/0241673 A1 * | 9/2013 | Yokoyama et al. ............ 333/189 |

FOREIGN PATENT DOCUMENTS

| | | |
|---|---|---|
| CN | 101064499 A | 10/2007 |
| CN | 101741343 A | 6/2010 |
| JP | 2002-344279 A | 11/2002 |
| JP | 2005-137002 A | 5/2005 |
| JP | 2005-277454 A | 10/2005 |
| JP | 2006-502634 A | 1/2006 |
| JP | 2007-510383 A | 4/2007 |
| JP | 2007-159123 A | 6/2007 |
| JP | 2009-010926 A | 1/2009 |
| WO | 2010/079614 A1 | 7/2010 |

OTHER PUBLICATIONS

Akiyama et al., "Enhancement of Piezoelectric Response in Scandium Aluminum Nitride Alloy Thin Films Prepared by Dual Reactive Cosputtering", Advanced Materials, 2009, vol. 21, pp. 593-596, Wiley-VCH Verlag GmbH & Co. KGaA, Weinheim.

Kabulski et al., "Erbium Alloyed Aluminum Nitride Films for Piezoelectric Applications", Mater. Res. Soc. Symp. Proc., 2009, vol. 1129, pp. 21-25, Materials Research Society.

Chinese Office Action dated Jan. 30, 2014, in a counterpart Chinese patent application No. 201110339535.8.

Japanese Office Action dated Mar. 4, 2014, in a counterpart Japanese patent application No. 2010-245452.

Chinese Office Action dated Jul. 10, 2014, in a counterpart Chinese patent application No. 201110339535.8.

* cited by examiner

ACOUSTIC WAVE DEVICE

CROSS-REFERENCE TO RELATED APPLICATION

This application is based upon and claims the benefit of priority of the prior Japanese Patent Application No. 2010-245452, filed on Nov. 1, 2010, the entire contents of which are incorporated herein by reference.

FIELD

A certain aspect of the present invention relates to acoustic wave devices.

BACKGROUND

A piezoelectric thin film resonator is used as a high frequency circuit of a cellular phone or the like. There are a film bulk acoustic resonator (FBAR) type and a solidly mounted resonator (SMR) type of piezoelectric thin film resonators. In late years, the balanced output is frequently requested at a reception terminal of an antenna duplexer. However, the filter using FBAR or SMR is not capable of converting unbalanced signals to balanced signals and the reverse. Thus, there has been developed a coupled resonator filter (CRF) structure capable of converting the unbalanced signals to the balanced signals and the reverse (for example, see non-Patent Document 1 (Improved Coupled Resonator Filter Performance using a Carbon-doped Oxide de-coupling Layer", IEEE Ultrasonics Symp., 2009)). CRF has a plurality of piezoelectric thin film resonators and a decoupler film. The piezoelectric thin film resonators are stacked so as to interpose the decoupler film therebetween.

Non-Patent Document 2 (Advanced Materials 2009, 21, pp. 593-596) describes that the piezoelectric constant is increased by adding Sc (scandium) to aluminum nitride. Non-Patent Document 3 (Mater. Res. Soc Symp. Proc., Vol. 1129, 2009, pp. 21-25) describes that the piezoelectric constant is increased by adding Er (erbium) to aluminum nitride.

In CRF, two resonance characteristics of an anti-symmetry mode of the low frequency side and a symmetric mode of the high frequency side appear. When too large spacing between two resonance frequencies results in a loss in the vicinity of the center of the band, the loss in the vicinity of the center of the band can be suppressed by reducing the acoustic impedance of the decoupler film. However, the reduction in the acoustic impedance of the decoupler film will increase the loss resulting from the decoupler film itself.

SUMMARY OF THE INVENTION

According to an aspect of the present invention, there is provided an acoustic wave device including: a first piezoelectric thin film resonator including a first lower electrode, a first upper electrode and a first piezoelectric film sandwiched between the first lower and upper electrodes, a decoupler film provided on the first upper electrode; and a second piezoelectric thin film resonator provided on the decoupler film and including a second lower electrode, a second upper electrode and a second piezoelectric film sandwiched between the second lower and upper electrodes, wherein the first piezoelectric film and the second piezoelectric film comprise aluminum nitride and include an element increasing a piezoelectric constant of the aluminum nitride.

DETAILED DESCRIPTION

First, a piezoelectric thin film resonator will be described. There are an FBAR type and an SMR type of resonators. FIG.

Figure 1A:
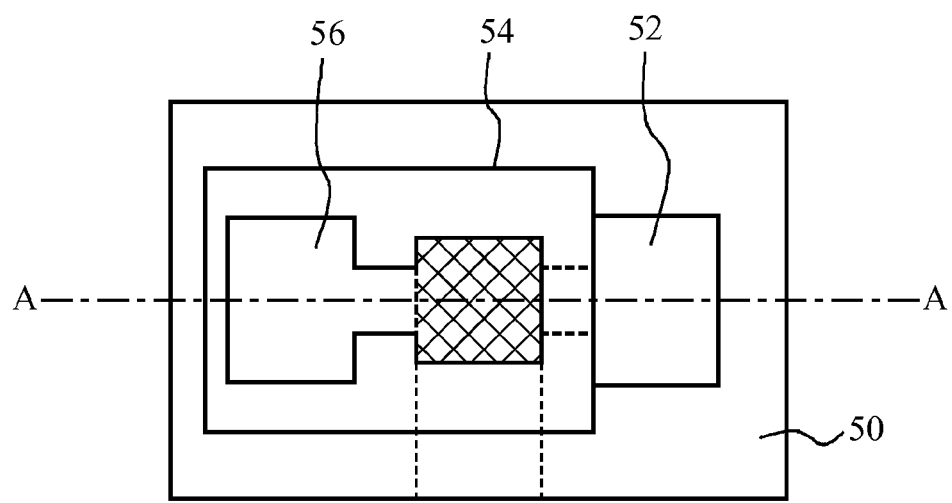
FIG. 1A is a plan view of a piezoelectric thin film resonator of an FBAR type.
Figure 1B:
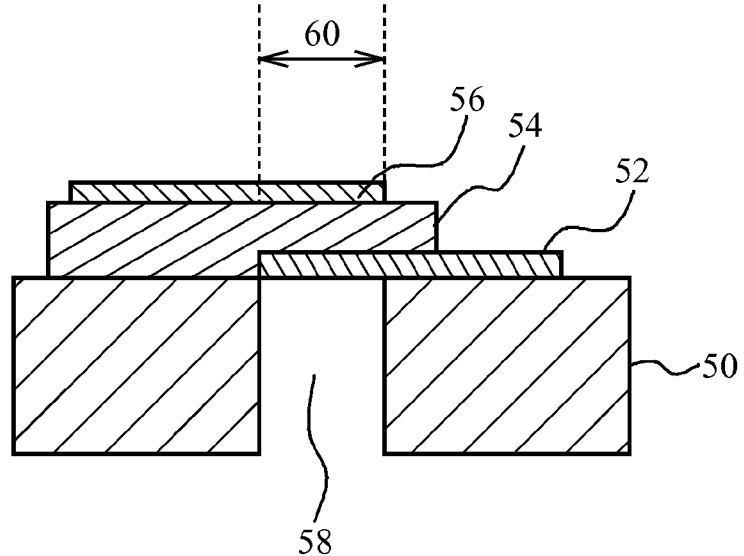
FIG. 1B is a sectional view taken along an A-A line of FIG. 1A.

1A is a plan view of an FBAR. FIG. 1B is a sectional view taken along a A-A line of FIG. 1A. The FBAR generally includes a substrate 50, a lower electrode 52, a piezoelectric film 54, and an upper electrode 56. The lower electrode 52 and the upper electrode 56 are provided on the substrate 50 to sandwich the piezoelectric film 54. A cavity 58 penetrating through the substrate 50 is formed under a portion (a resonance area 60) where the upper electrode 56 and the lower electrode 52 face each other across the piezoelectric film 54.

Figure 2:
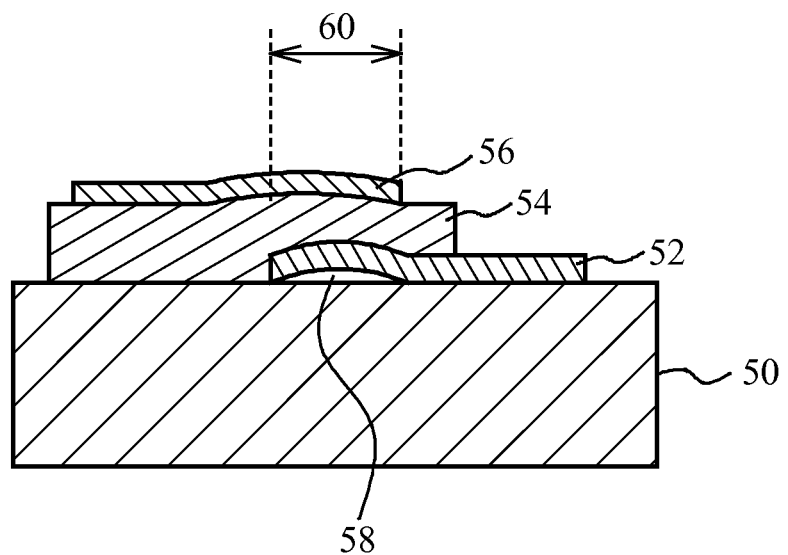
FIG. 2 is a sectional view of another exemplary piezoelectric thin film resonator of the FBAR type.

FIG. 2 is a sectional view of another exemplary FBAR. An upper surface of the substrate 50 is flat, and a the lower electrode 52 is formed so that a cavity 58 is formed between the substrate 50 and the lower electrode 52. For example, the cavity 58 has a dome shape. The cavity 58 between the substrate 50 and the lower electrode 52 may be a recess formed in the substrate 50.

Figure 3:
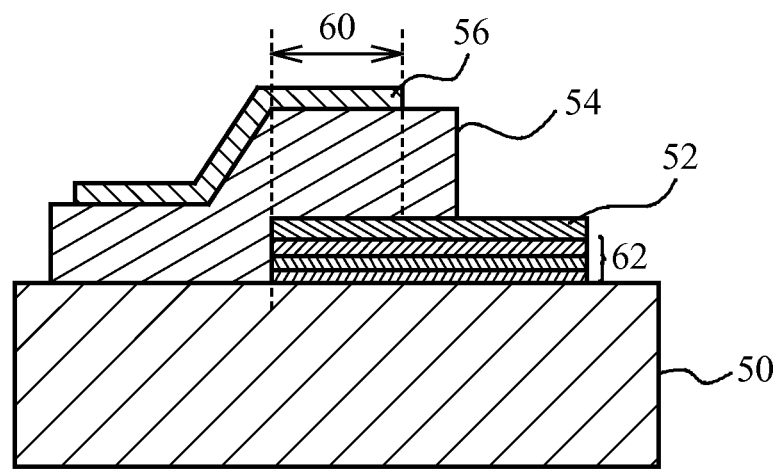
FIG. 3 is a sectional view of a piezoelectric thin film resonator of an SMR type.

FIG. 3 is a sectional view of an SMR. Acoustic reflection films 62 are formed under the lower electrode 52 of the resonance area 60. The acoustic reflection films 62 are films in which a film having a high acoustic impedance and a thickness of $\lambda/4$ and a film having a low acoustic impedance and a thickness of $\lambda/4$ are stacked alternately. Here, $\lambda$ is the wavelength of the acoustic wave. In the piezoelectric thin film resonators illustrated in FIGS. 1A to 3A, Mo (molybdenum), W (tungsten), Ru (ruthenium), or the like are often used for the lower electrode 52 and the upper electrode 56. AlN (aluminum nitride) is often used to form the piezoelectric film 54. Si (silicon) is often sued to form the substrate 50.

Figure 4:
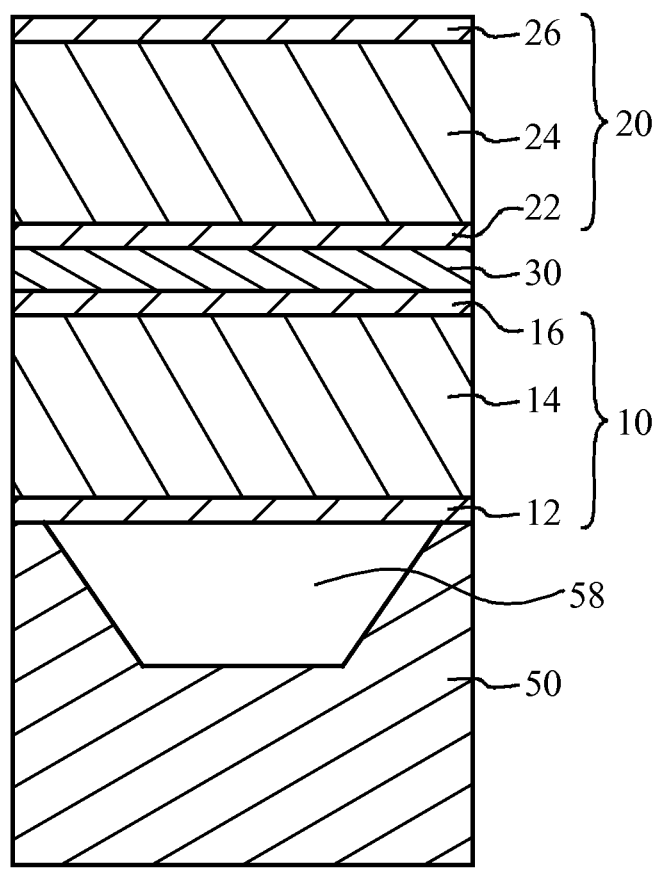
FIG. 4 is a sectional view of a CRF according to a comparative example 1.

Next, a CRF will be described. FIG. 4 is a sectional view of the CRF according to a comparative example 1. A first piezoelectric thin film resonator 10 and a second piezoelectric thin film resonator 20 are stacked on the substrate 50. The first piezoelectric thin film resonator 10 includes a first lower electrode 12, a first piezoelectric film 14, and a first upper electrode 16. The second piezoelectric thin film resonator 20 includes a second lower electrode 22, a second piezoelectric film 24, and a second upper electrode 26. A single-layered decoupler film 30 is formed between the first piezoelectric thin film resonator 10 and the second piezoelectric thin film resonator 20. The cavity 58 is provided under the first lower electrode 12 in the resonance area.

Figure 5:
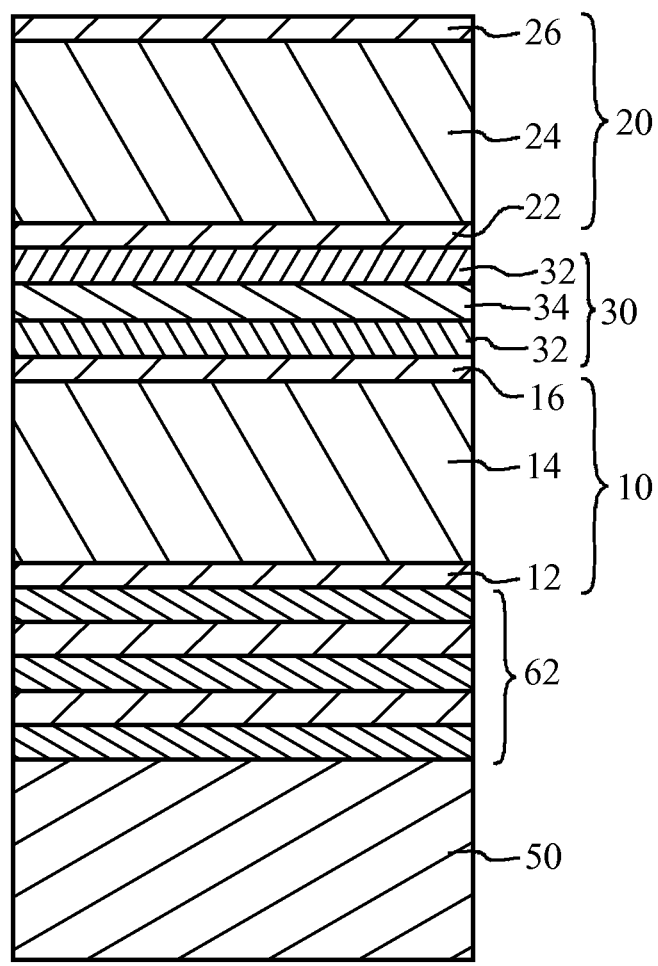
FIG. 5 is a sectional view of a CRF according to a comparative example 2.

FIG. 5 is a sectional view of a CRF according to a comparative example 2. As compared with the comparative example 1, the decoupler film 30 has multiple stacked films such as films 32 and 34. The acoustic reflection films 62 are formed under the first lower electrode 12. The other components are the same as those of the comparative example 1 illustrated in FIG. 4, and a description thereof is omitted here.

Since the decoupler film 30 is formed by the single film in the comparative example 1, a small number of manufacturing processes is used and the thickness of the film is controlled easily, as compared with the comparative example 2 that employs the decoupler film 30 composed of the multiple films. However, there is a problem that will be described below.

Figure 6:
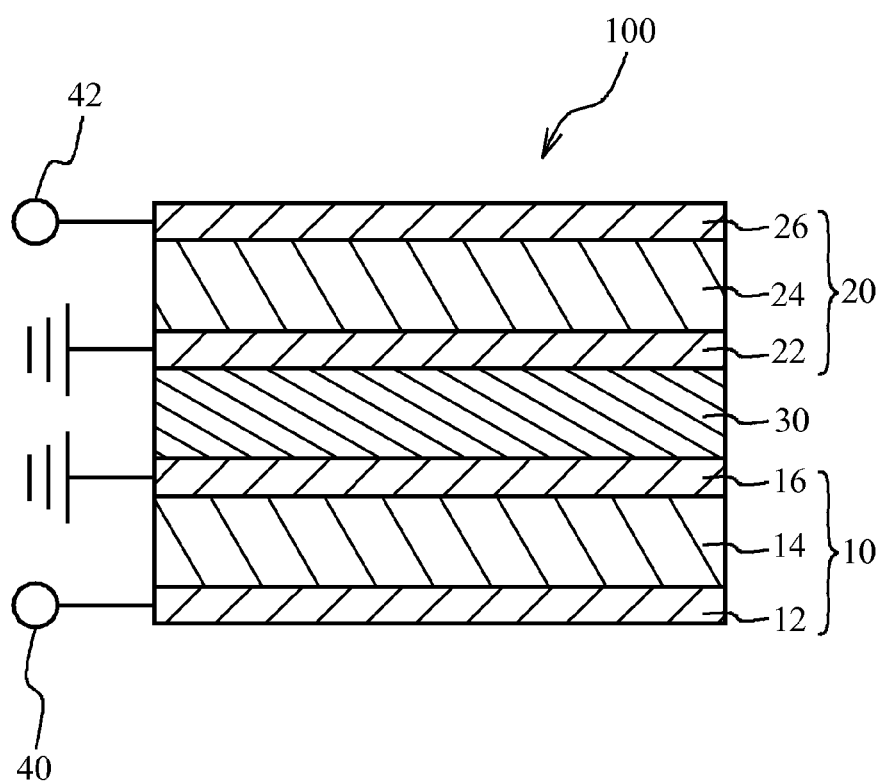
FIG. 6 is a schematically sectional view of the CRF according to the comparative example 1 in simulation.

The decoupler film 30 formed by the single film is simulated. FIG. 6 is a schematically sectional view of the CRF according to the comparative example 1 in simulation. A CRF 100 includes the first piezoelectric thin film resonator 10, the second piezoelectric thin film resonator 20, and the decoupler film 30. The first piezoelectric thin film resonator 10 includes the first lower electrode 12, the first upper electrode 16 and the first piezoelectric film 14 sandwiched between the electrodes 12 and 16. The decoupler film 30 is provided on the first upper electrode 16. The second piezoelectric thin film resonator 20 is provided on the decoupler film 30, and includes the second lower electrode 22, the second upper electrode 26, and the second piezoelectric film 24 sandwiched between the electrodes 22 and 26. The first piezoelectric thin film resonator 10 and the second piezoelectric thin film resonator 20 are stacked to sandwich the decoupler film 30. The first lower electrode 12 and the second upper electrode 26 are connected to input/output terminals 40 and 42, respectively. The first upper electrode 16 and the second lower electrode 22 are grounded.

The simulation is performed under the following conditions. Each of the first lower electrode 12, the first upper electrode 16, the second lower electrode 22, and the second upper electrode 26 is a Ru film having a thickness of 100 nm. Each of the first piezoelectric film 14 and the second piezoelectric film 24 is an AlN film having a thickness of 800 nm, and the decoupler film 30 is 450 nm thick. In the simulation, the acoustic impedance of the decoupler film 30 is changed.

Figure 7A:
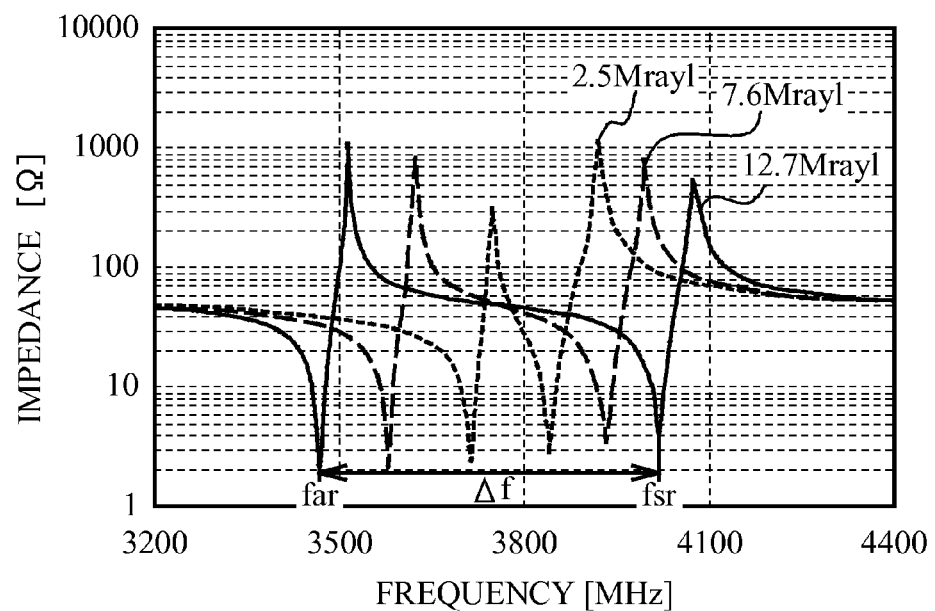
FIG. 7A is a graph of an impedance vs. frequency characteristic.
Figure 7B:
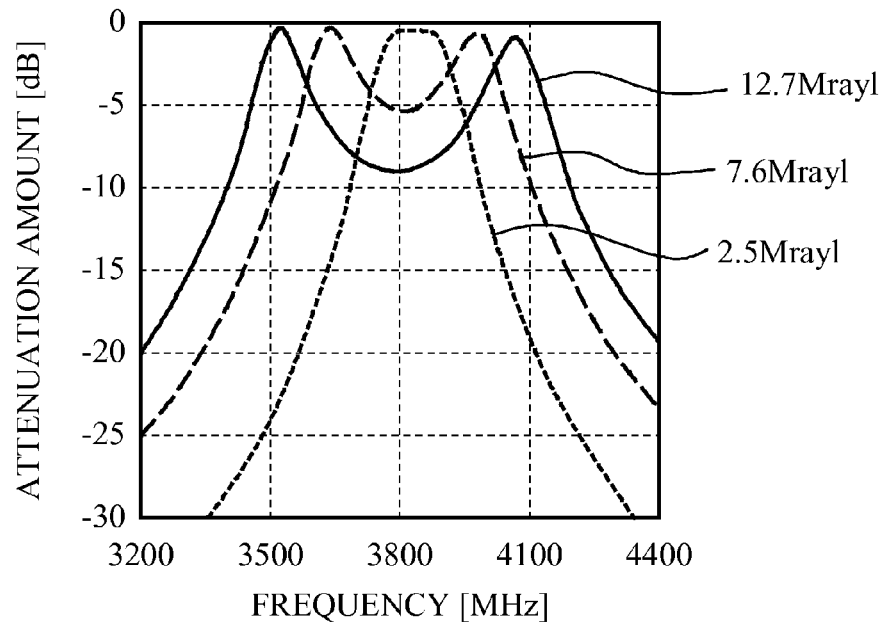
FIG. 7B is a graph of a passband (S21) characteristic.

FIG. 7A is a graph of an impedance vs. frequency characteristic of the comparative example 1. FIG. 7B is a graph of a passband (S21) characteristic of the comparative example 1. The impedance is a characteristic when the input/output terminal 40 is grounded. The passband characteristic corresponds to S21 between the input/output terminals 40 and 42. In FIGS. 7A and 7B, solid lines, broken lines, and dotted lines indicate simulation results under conditions that the acoustic impedance of the decoupler film 30 is 12.7 Mrayl, 7.6 Mrayl, and 2.5 Mrayl, respectively. It is to be noted that 12.7 Mrayl corresponds to the acoustic impedance of the silicon oxide film.

Figure 8:
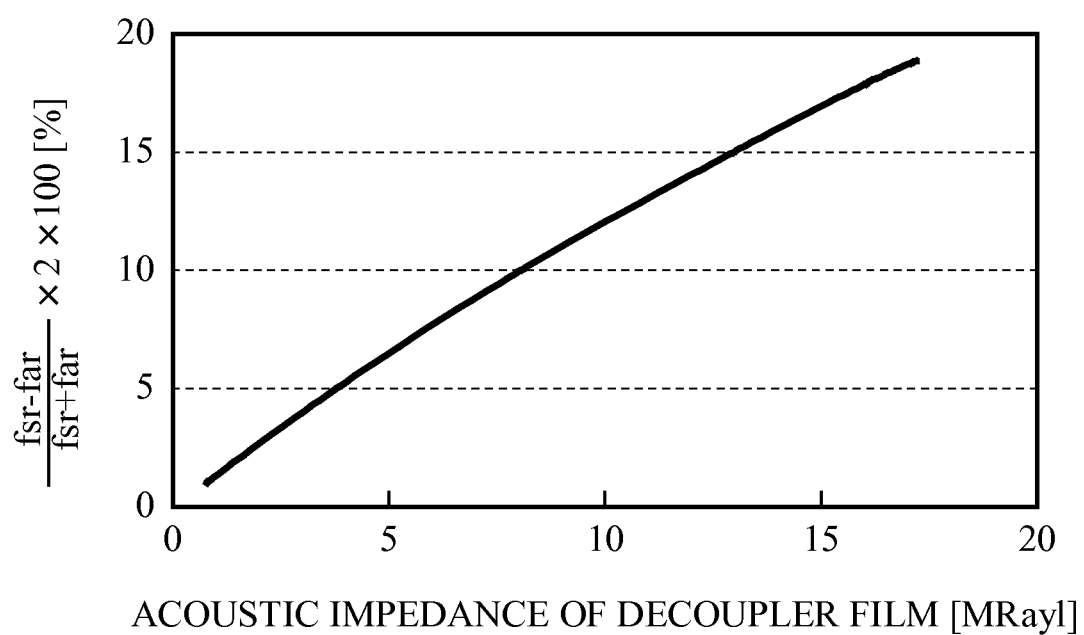
FIG. 8 is a graph of a resonance frequency spacing ratio associated with an acoustic impedance of a decoupler film.

As illustrated in FIG. 7A, the CRF has a resonance characteristic of the anti-symmetric mode at the low frequency side (this frequency is referred to as far) and another resonance characteristic of the symmetry mode at the high frequency side (this frequency is referred to as fsr). A spacing between the resonance frequencies of the two modes fsr and far is referred to as a resonance frequency spacing $\Delta f$. FIG. 8 illustrates a resonance frequency spacing ratio associated with the acoustic impedance of the decoupler film 30. The resonance frequency spacing ratio is defined as $(fsr-far)/(fsr+far) \times 2 \times 100$. As illustrated in FIG. 8, the resonance frequency spacing ratio simply increases as the acoustic impedance of the decoupler film 30 increases. As illustrated in FIG. 7B, a large spacing between the resonance frequencies leads to an increase in the loss at the band center of the communication band due to the impedance mismatch. On the other hand, a small spacing between the resonance frequencies reduces the loss at the band center of the communication band. Thus, according to FIGS. 7A to 8, a reduced acoustic impedance of the decoupler film 30 reduces the spacing $\Delta f$ between the resonance frequencies, thereby reducing the loss at the band center of the communication band.

Figure 9:
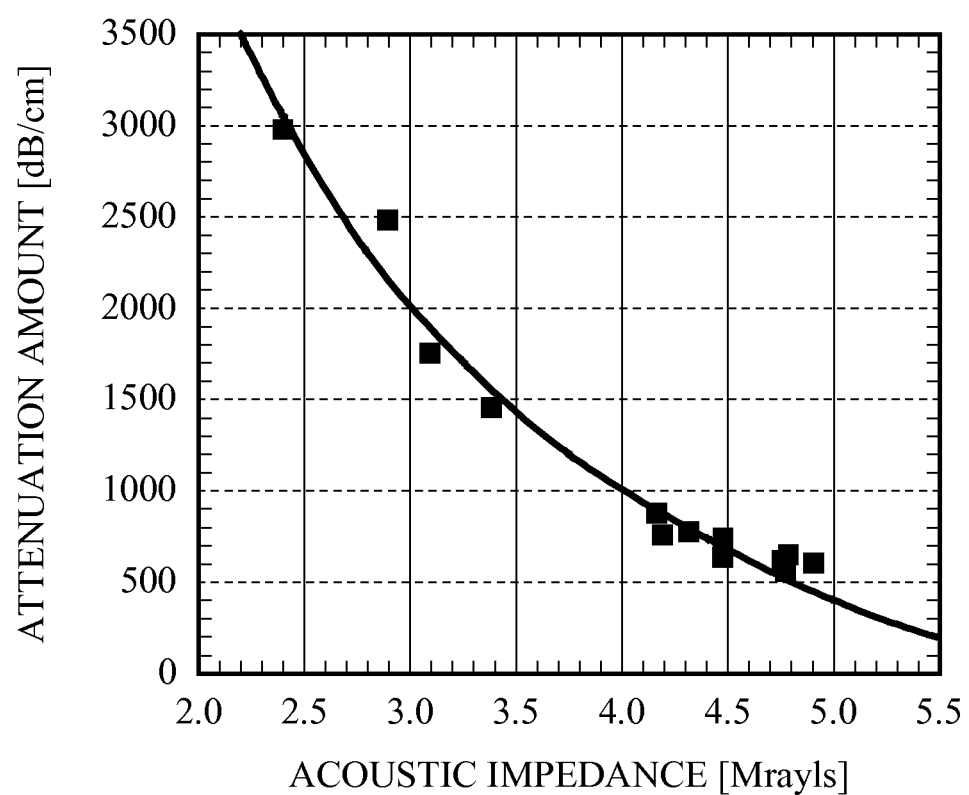
FIG. 9 is a graph of an attenuation vs. acoustic impedance characteristic of the decoupler film.

However, the simulation illustrated in FIGS. 7A to 8 does not consider the loss of the decoupler film 30 itself. FIG. 9 illustrates the amount of attenuation associated with the acoustic impedance of the decoupler film 30. FIG. 9 is described in the aforementioned Non-Patent Document 1. As illustrated in FIG. 9, the propagation loss of the decoupler film 30 increases as the acoustic impedance of the decoupler film 30 reduces. Thus, a simple change of the acoustic impedance of the decoupler film 30 as described above results in a trade-off relationship between the loss at the band center of the passband and the propagation loss.

For example, referring to FIG. 9, the decoupler film 30 having an acoustic impedance of 5 Mrayl or higher is capable of reducing the propagation loss. For example, a silicon oxide (for example, $SiO_2$) film having an acoustic impedance of 13 Mrayl is capable of suppressing the propagation loss of the decoupler film 30. However, this case increases the spacing Δf between the resonance frequencies, and thus increases the loss at the center of the passband.

As described above, the use of the single film for the decoupler film 30 results in the trade-off relationship between the loss at the band center of the passband and the propagation loss. According to aspects of embodiments described below, the above problems are taken into consideration.

Embodiment 1

An embodiment 1 improves the piezoelectric constant of a piezoelectric film. First, a description will be given of the significance of improving the piezoelectric constant of the piezoelectric film. A structure of each film used in simulation is the same as one of the comparative example 1. The decoupler film 30 is a silicon oxide film and has an acoustic impedance of 12.7 Mrayl.

Figure 10A:
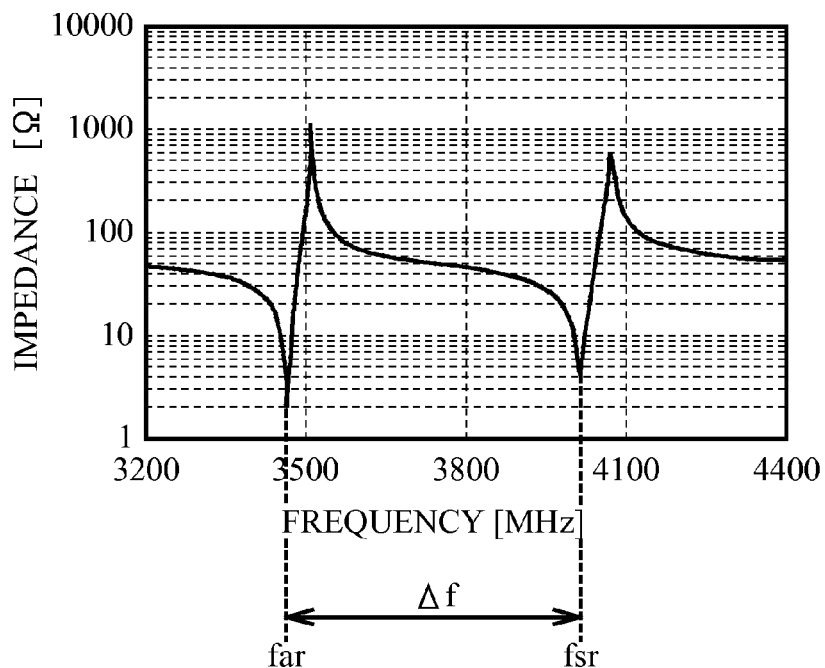
FIG. 10A is a graph of an impedance vs. a frequency characteristic of the comparative example 1 in a case where the decoupler film is a silicon oxide film.
Figure 10B:
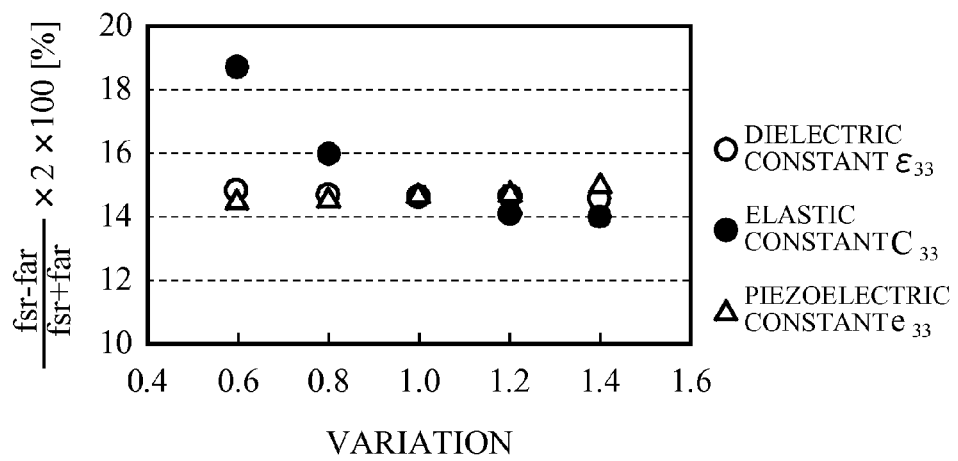
FIG. 10B is a graph of resonance frequency spacing ratios associated with variations of a dielectric constant, an elastic constant, and a piezoelectric constant.

FIG. 10A is a graph of an impedance vs. frequency characteristic of the comparative example 1 in which the decoupler film 30 is a silicon oxide film. The spacing between the two modes is set to the spacing Δf between resonance frequencies. FIG. 10B is a graph of the resonance frequency spacing ratio ((fsr−far)/(fsr+far)×2×100) associated with variations of the dielectric constant (white circle), the elastic constant (black circle), and the piezoelectric constant (white triangle) of the piezoelectric films 14 and 24. The variations are values normalized by using, as reference values, the standard parameter values of aluminum nitride having an orientation with the main axis in the (002) direction. The standard values of the dielectric constant ($\in 33$), the elastic constant (c33), and the piezoelectric constant (e33) are $8.91 \times 10^{11}$ F/m, $4.29 \times 10^{-11}$ Pa, and 1.55 C/m², respectively. It is to be noted that the piezoelectric thin film resonator uses acoustic waves that are propagated upwardly and downwardly. Thus, the dielectric constant ($\in 33$), the elastic constant (c33), and the piezoelectric constant (e33) mainly influence the property of aluminum nitride having the orientation with the main axis in the (002) direction. Therefore, these parameters are used in the simulation.

As illustrated in FIG. 10B, the spacing between resonance frequencies does not change greatly for variations of the dielectric constant and the piezoelectric constant. In contrast, the spacing between the resonance frequencies increases as the elastic constant decreases, and this is not preferable.

The electromechanical coupling constant k33 is represented with the following expression, and a decrease in the elastic constant means an increase in the electromechanical coupling constant.

$$k33^2 = e33^2/(\in 33 \cdot c33)$$

Figure 11A:
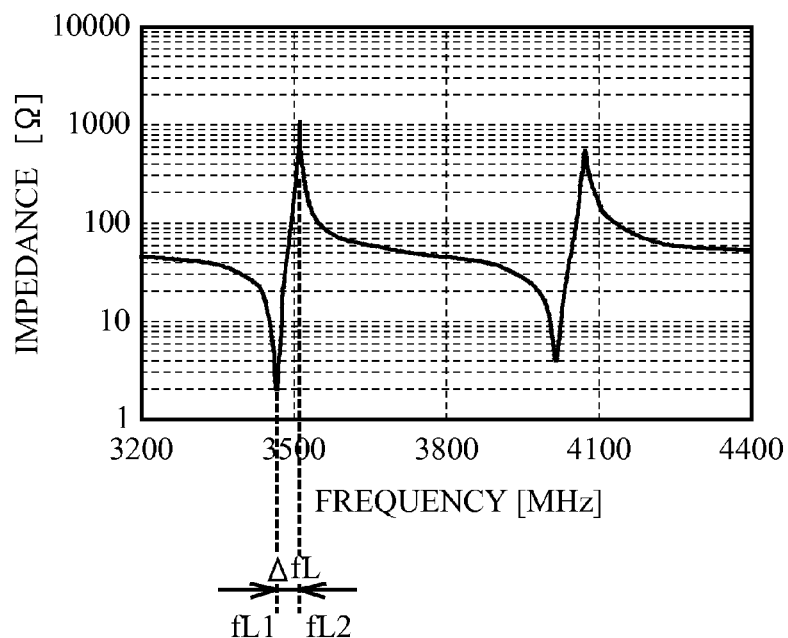
FIG. 11A is a graph of a spacing $\Delta fL$ between resonance/anti-resonance frequencies in the symmetry mode at a low frequency side.
Figure 11B:
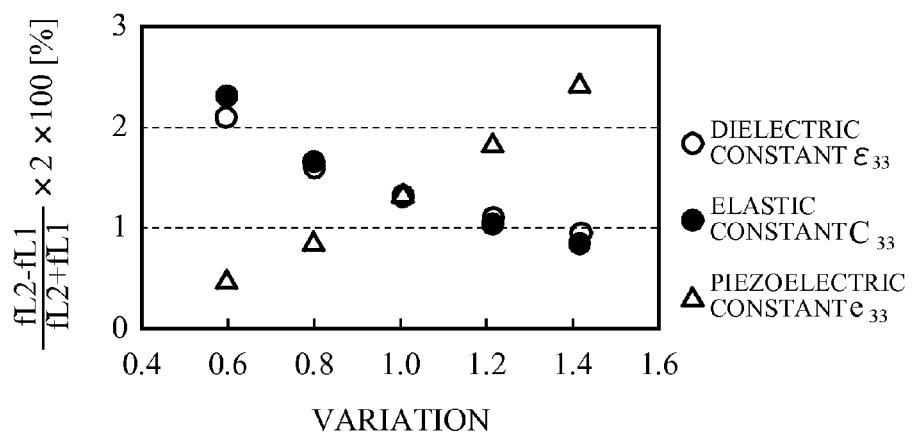
FIG. 11B is a graph of spacing ratios between resonance/anti-resonance frequencies associated with variations of a dielectric constant, an elastic constant, and a piezoelectric constant.

FIG. 11A illustrates a spacing ΔfL between the resonance frequency and the anti-resonance frequency in the symmetry mode at the low frequency side. FIG. 11B illustrates a resonance/anti-resonance frequency spacing ratio ((fL2−fL1)/(fL2+fL1)×2×100) associated with variations of the dielectric constant (white circle), the elastic constant (black circle), and the piezoelectric constant (white triangle) of the piezoelectric films 14 and 24. The variations are values normalized by using, as reference values, the standard parameter values of aluminum nitride having an orientation with the main axis in the (002) direction. The spacing ΔfL between the resonance frequency and the anti-resonance frequency increases as the dielectric constant and the elastic constant reduce as illustrated in FIG. 11B. On the contrary, the spacing ΔfL between the resonance frequency and the anti-resonance frequency in the symmetry mode at the low frequency side increases as the piezoelectric constant increases. When the variations of the spacing ΔfL for the dielectric constant and the elastic constant are the same are those for the piezoelectric constant, the use of the piezoelectric constant increases the spacing ΔfL most efficiently. Decreases in the dielectric constant and the elastic constant, and an increase in the piezoelectric constant mean an increase in the electromechanical coupling constant k33.

Figure 12A:
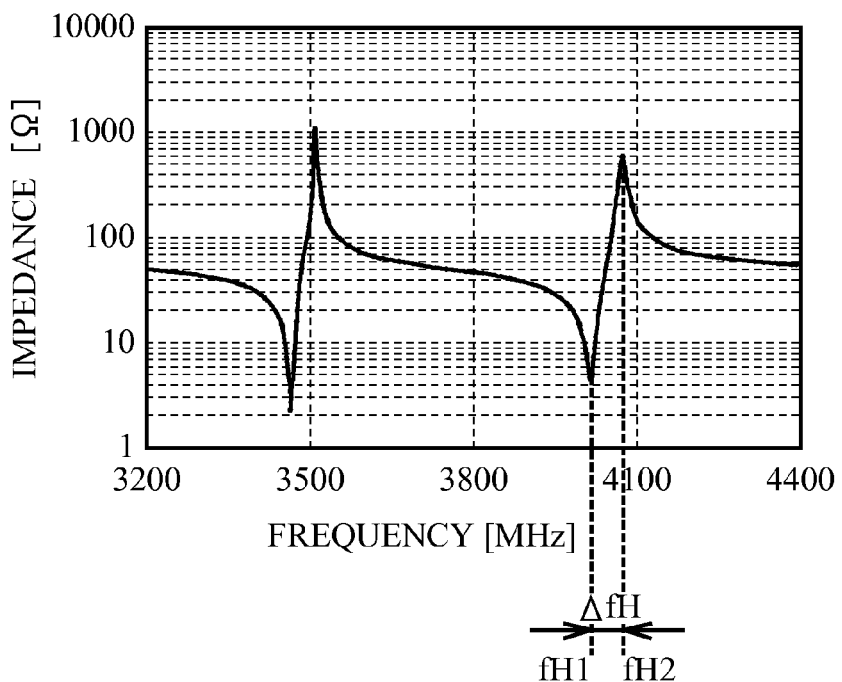
FIG. 12A is a graph of a spacing ratio $\Delta fH$ between resonance/anti-resonance frequencies in the symmetry mode at a high frequency side.
Figure 12B:
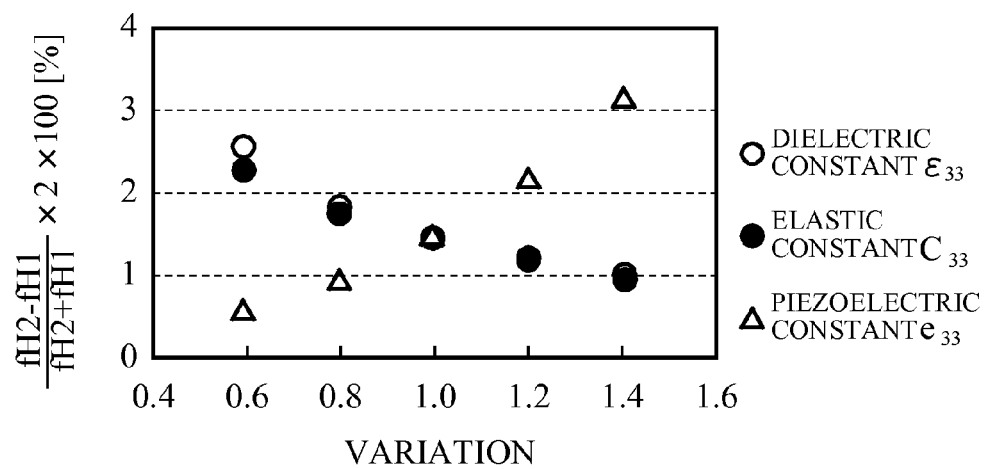
FIG. 12B is a graph of spacing ratios between resonance/anti-resonance frequencies associated with variations of a dielectric constant, an elastic constant, and a piezoelectric constant.

FIG. 12A illustrates a spacing ΔfH between the resonance frequency and the anti-resonance frequency in the symmetry mode at the high frequency side. FIG. 12B illustrates a resonance/anti-resonance frequency spacing ratio ((fH2−fH1)/(fH2+fH1)×2×100) associated with variations of the dielectric constant (white circle), the elastic constant (black circle), and the piezoelectric constant (white triangle). The variations are values normalized by using, as reference values, the standard parameter values of aluminum nitride having an orientation with the main axis in the (002) direction. The spacing ΔfH between the resonance frequency and the anti-resonance frequency increases as the dielectric constant and the elastic constant reduce as illustrated in FIG. 12B. In contrast, the spacing ΔfH between the resonance frequency and the anti-resonance frequency in the symmetry mode at the high frequency side increases as the piezoelectric constant increases. When the variations of the spacing ΔfH for the dielectric constant and the elastic constant are the same are those for the piezoelectric constant, the use of the piezoelectric constant increases ΔfH most efficiently. Decreases in the dielectric constant and the elastic constant, and an increase in the piezoelectric constant mean an increase in the electromechanical coupling constant k33.

Large spacings ΔfL and ΔfH between the resonance frequency and the anti-resonance frequency are large improve the loss at the center of the passband in the CRF. Therefore, improvement in the piezoelectric constant of the piezoelectric film reduces the loss of the center of the passband in the CRF most efficiently.

The simulation is performed under the following conditions. Each of the first lower electrode 12, the first upper electrode 16, the second lower electrode 22, and the second upper electrode 26 is a W film having a thickness of 85 nm. Each of the first piezoelectric film 14 and the second piezoelectric film 24 is an aluminum nitride film having a thickness of 680 nm. The decoupler film 30 is a silicon oxide film having a thickness of 385 nm. The piezoelectric constants of the first piezoelectric film 14 and the second piezoelectric film 24 are changed from the standard reference value of the piezoelectric constant (e33) of aluminum nitride.

Figure 13A:
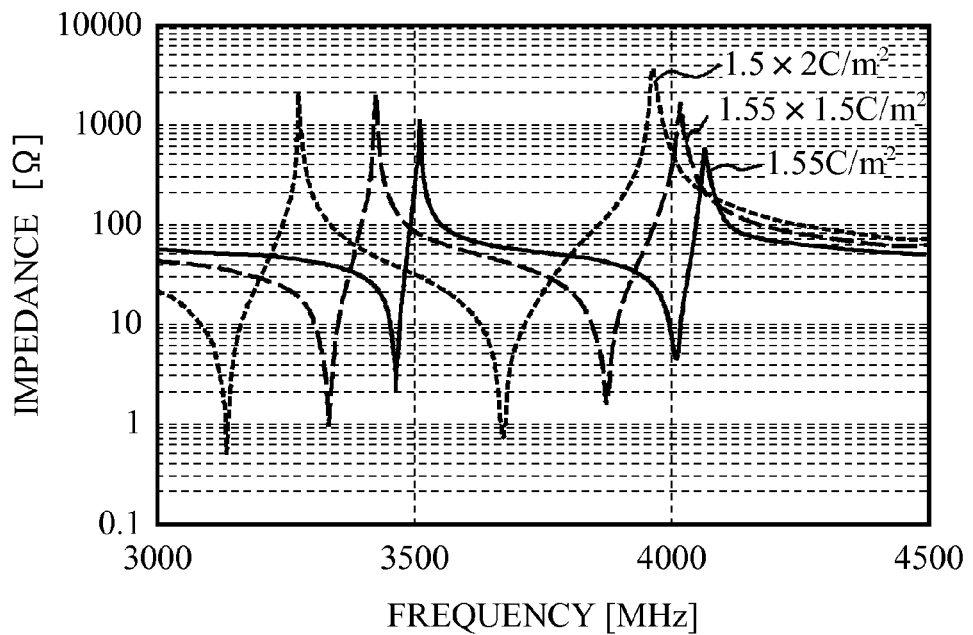
FIG. 13A is a graph of an impedance vs. frequency characteristic.
Figure 13B:
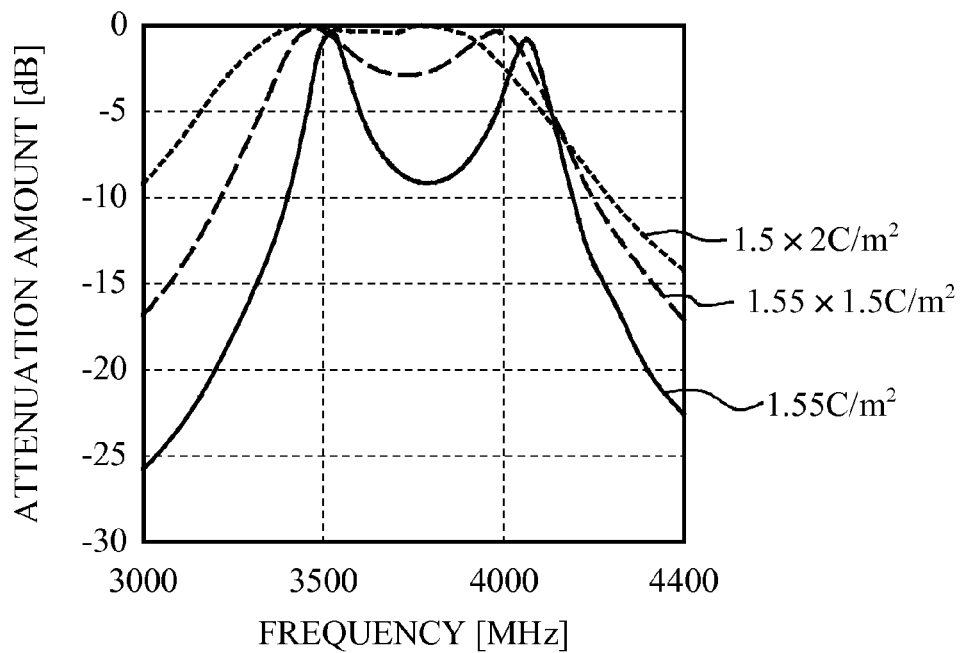
FIG. 13B is a graph of a passband characteristics.

FIG. 13A illustrates an impedance vs. frequency characteristic. FIG. 13B illustrates a passband characteristic. In FIGS. 13A and 13B, solid lines, broken lines, and dotted lines indicate simulation results under conditions that a piezoelectric constant (e33) is 1.55 C/m² (the standard value of aluminum nitride), 1.55×1.5 C/m² (1.5 times the standard value of aluminum nitride), and 1.55×2 C/m² (twice the standard value of the aluminum nitride), respectively. When the piezoelectric constants of the first piezoelectric film 14 and the second piezoelectric film 24 increase as illustrated in FIG. 13A, the spacings Δf between the resonance frequencies in the two modes are substantially the same as each other, whereas the spacings ΔfL and ΔfH between the resonance frequency and the anti-resonance frequency in the two modes increase. When the piezoelectric constant of the piezoelectric film increases, the loss at the center of the passband reduces as illustrated in FIG. 13B.

Figure 14:
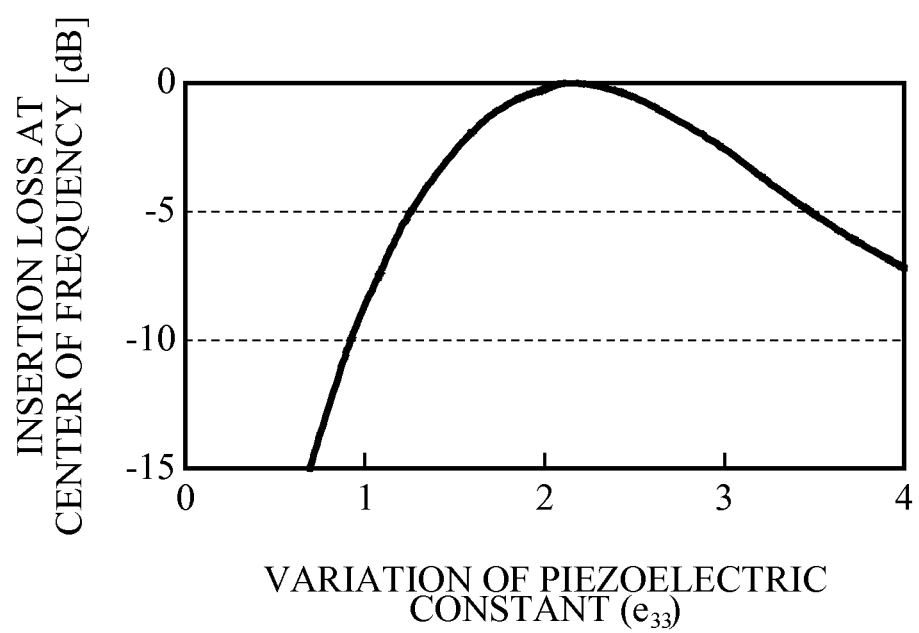
FIG. 14 is a graph of an insertion loss at the center of the passband associated with a variation of the piezoelectric constant.

FIG. 14 illustrates an insertion loss at the center of the passband associated with a variation of the piezoelectric constant. The piezoelectric constant (e33) is normalized by 1.55

$C/m^2$, which is the standard value of aluminum nitride. An increase in the piezoelectric constant decreases the insertion loss at the center of the passband, as illustrated in FIG. 14. When the variation of the piezoelectric constant is two, the insertion loss is the smallest. As the variation of the piezoelectric constant increases from two, the insertion loss increases.

For example, in order to realize an insertion loss of −6 dB or less at the band center of the passband, it is preferable that the piezoelectric constant (e33) should be 1.1 to 3.9 times the standard value of aluminum nitride. In order to realize an insertion loss of −4 dB or less, it is preferable that the piezoelectric constant (e33) should be 1.3 to 3.3 times the standard value of aluminum nitride.

As described above, the increase in the piezoelectric constants of the first piezoelectric film 14 and the second piezoelectric film 24 decreases the loss at the band center. For example, in order to increase the piezoelectric constant of the first piezoelectric film 14 and the second piezoelectric film 24, Sc (scandium) or Er (erbium) is added to aluminum nitride as Non-Patent Documents 2 and 3.

In the embodiment 1, each of the first piezoelectric film 14 and the second piezoelectric film 24 is made of aluminum nitride including an element increasing the piezoelectric constant. In other words, as compared with the case without adding an element to the first piezoelectric film 14 or the second piezoelectric film 24, the element is added so as to increase the piezoelectric constant. For example, scandium or erbium is added. This can suppress the loss at the band center of the passband. Besides scandium or erbium, it is possible to use another element that improves the piezoelectric constant of aluminum nitride.

The material constant such as the piezoelectric constant of aluminum nitride depends on the crystalline orientation. The crystalline orientation is greatly influenced by a roughness of an underlying film. For example, in cases where aluminum nitride is formed by sputtering, a bad roughness of the underlying film may degrade the orientation of aluminum nitride and decrease the piezoelectric constant. Thus, the first piezoelectric film 14 and the second piezoelectric film 24 may have different resonance characteristics. Thus, the amounts of the element added to the first piezoelectric film 14 and the second piezoelectric film 24 may be made different from each other. This allows the first piezoelectric film 14 and the second piezoelectric film 24 to have almost the same piezoelectric constants and almost the same resonance characteristics.

Also, the roughness of the upper film is subject to deterioration more easily than that of the lower film. Therefore, the first orientation of the second piezoelectric film 24 tends to be deteriorated more easily than that of the first piezoelectric film 14. For this reason, the resonance characteristic of the second piezoelectric thin film resonator 20 tends to be deteriorated more easily than that of the piezoelectric thin film resonator 10. Thus, the amount of the element added to the second piezoelectric film 24 is made different from that of the first piezoelectric film 14. For example, an increased amount of the element is added to the second piezoelectric film 24. It is thus possible to control the second piezoelectric thin film resonator 20 and the first piezoelectric film resonator 10 to have almost the same resonance characteristics.

Embodiment 2

Figure 15:
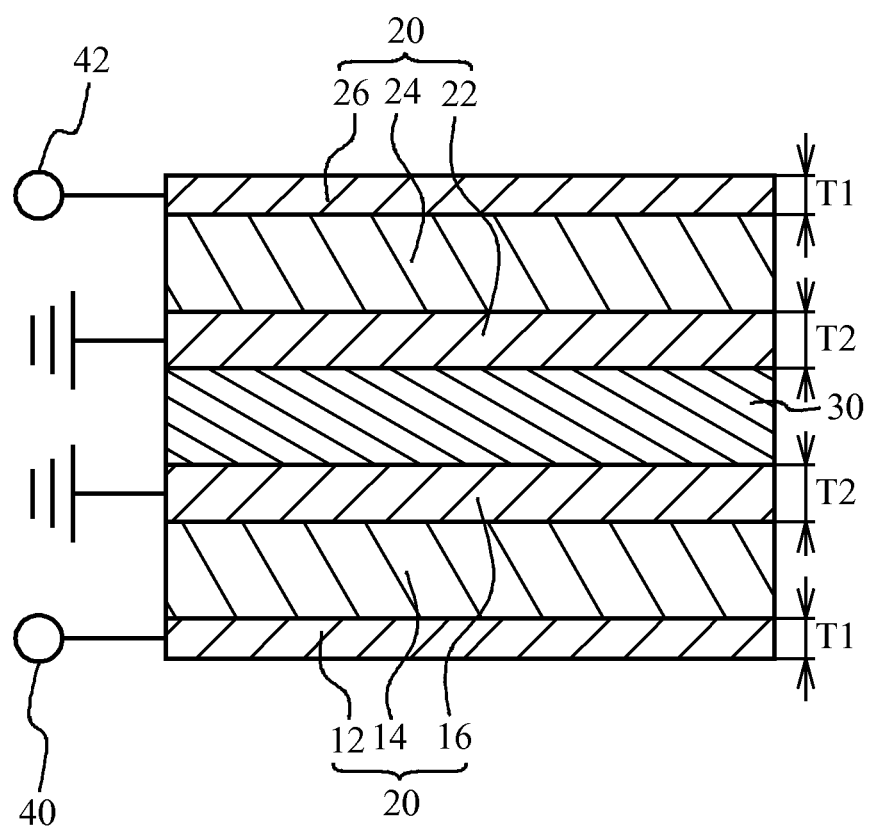
FIG. 15 is a view of a structure of a CRF according to an embodiment 2 in simulation.

An embodiment 2 has an exemplary structure in which the electrodes have different film thicknesses. FIG. 15 illustrates a structure of a CRF according to the embodiment 2 in simulation. As illustrated in FIG. 15, T1 indicates the film thickness of each of the first lower electrode 12 and the second upper electrode 26, and T2 indicates the film thickness of each of the first upper electrode 16 and the second lower electrode 22. The other arrangements are the same as those illustrated in FIG. 1, and a description thereof is omitted here. The simulation is performed under the following conditions. Each of the first lower electrode 12, the first upper electrode 16, the second lower electrode 22, and the second upper electrode 26 is a Ru film. Each of the first piezoelectric film 14 and the second piezoelectric film 24 is an AlN film having a thickness of 800 nm and a piezoelectric constant (e33) of 1.55 $C/m^2$. The decoupler film 30 is a silicon oxide film that is 450 nm thick. In the simulation, the film thicknesses T1 of the first lower electrode 12 and the second upper electrode 26 and the film thicknesses T2 of the first upper electrode 16 and the second lower electrode 22 are changed. The sum of T1 and T2 is fixedly set to 200 nm.

Figure 16A:
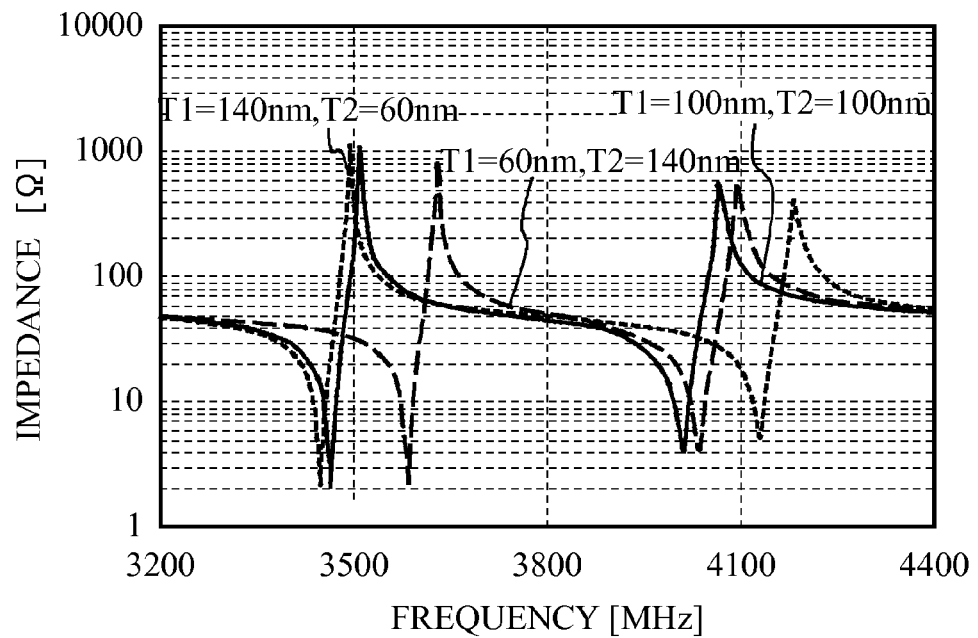
FIG. 16A is a graph of an impedance vs. the frequency characteristic.
Figure 16B:
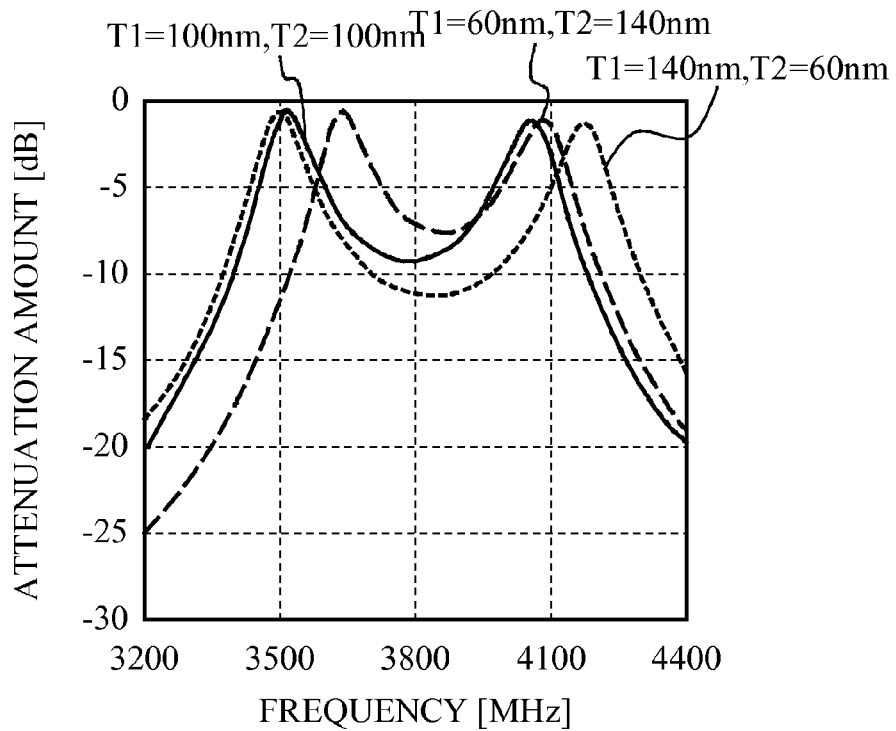
FIG. 16B is a view of a passband characteristic.
Figure 17:
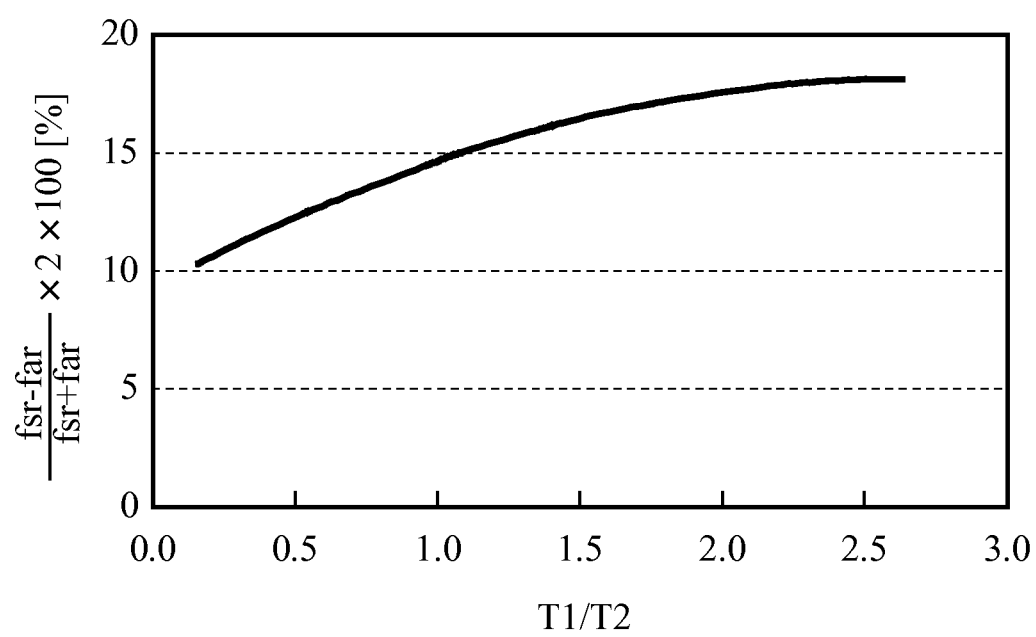
FIG. 17 is a view of a resonance frequency spacing $\Delta f$ associated with film thickness T1/film thickness T2.

FIG. 16A is a graph of an impedance vs. frequency characteristic. FIG. 16B is a graph of a passband characteristic. FIG. 17 is a graph of the spacing Δf between the resonance frequencies associated with T1/T2. In FIGS. 16A and 16B, solid lines indicate simulation results under conditions that T1 is 100 nm and T2 is 100 nm (T1/T2=1.0). Broken lines indicate simulation results under conditions that T1 is 60 nm and T2 is 140 nm (T1/T2=0.43). Dotted lines indicate simulation results under conditions that T1 is 140 nm and T2 is 60 nm (T1/T2=2.33). When T1/T2 decreases, the spacing between the resonance frequencies in the two modes decreases as illustrated in FIGS. 16A and 17. Therefore, the loss at the band center decreases as illustrated in FIG. 16B.

In the embodiment 2, the film thicknesses of the first upper electrode 16 and the second lower electrode 22 are made larger than those of the first lower electrode 12 and the second upper electrode 26. It is thus possible to reduce the loss at the band center of the passband. For example, when the first upper electrode 16 and the second lower electrode 22 are different in film thickness from each other and the first lower electrode 12 and the second upper electrode 26 are different in the film thickness from each other, it is preferable that the film thickness of a thinner one of the first upper electrode 16 and the second lower electrode 22 should be greater than that of a thicker one of the first lower electrode 12 and the second upper electrode 26.

For example, when the decoupler film 30 such as the silicon oxide film having a high acoustic impedance is employed, the spacing between resonance frequencies is increased. Thus, T1/T2 is decreased, and the loss at the center of the passband is thus suppressed. In contrast, the spacing between the resonance frequencies is decreased in the case of using the decoupler film 30 having a low acoustic impedance, which may be, for example, 2.5 Mrayl in FIG. 7B. Thus, T1/T2 is increased, and broadband is achieved. As described above, the use of the decoupler film 30 having an acoustic impedance as small as not greater than 5 Mrayl makes it possible to set the thicknesses of the first upper electrode 16 and the second lower electrode 22 smaller than those of the first lower electrode 12 and the second upper electrode 26.

As described above, the ratio of T1 and T2 is adjusted to control the spacing between the resonance frequencies, and the band characteristics of the CRF consequently. For the adjustment of T1 and T2, the first upper electrode 16 and the second lower electrode 22 may have film thicknesses different from those of the first lower electrode 12 and the second upper electrode 26.

Embodiment 3

An embodiment 3 has an exemplary structure in which the electrodes have different acoustic impedances. The simulation is performed by using a CRF having the same structure as one illustrated in FIG. 6 under the following conditions. The first lower electrode 12, the first upper electrode 16, the second lower electrode 22, and the second upper electrode 26 are made of Ru and are 100 nm thick. Each of the first piezoelectric film 14 and the second piezoelectric film 24 is an AlN film having a thickness of 800 nm and a piezoelectric constant (e33) equal to 1.5 times 1.55 C/m². The decoupler film 30 is a silicon oxide film having a thickness of 450 nm. In the simulation, the acoustic impedances of the first lower electrode 12, the first upper electrode 16, the second lower electrode 22, and the second upper electrode 26 are changed. Since changing the acoustic impedances varies the frequencies, a thickness correction is made by multiplying the film thickness of each layer by an identical correction coefficient so that the frequencies are substantially the same as each other.

Figure 18A:
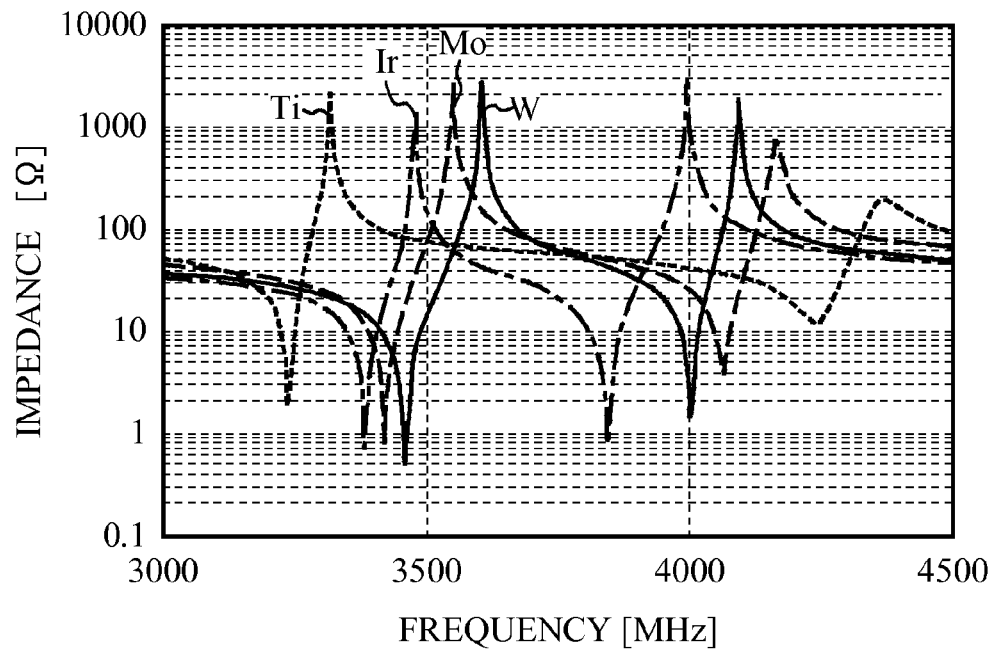
FIG. 18A is a graph of an impedance vs. the frequency characteristic.
Figure 18B:
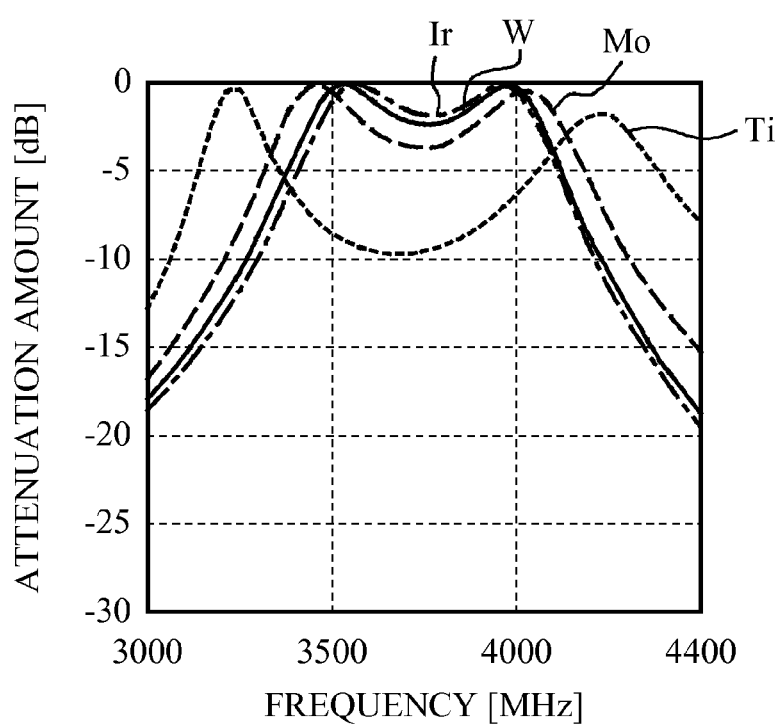
FIG. 18B is a graph of a passband characteristic.
Figure 19:
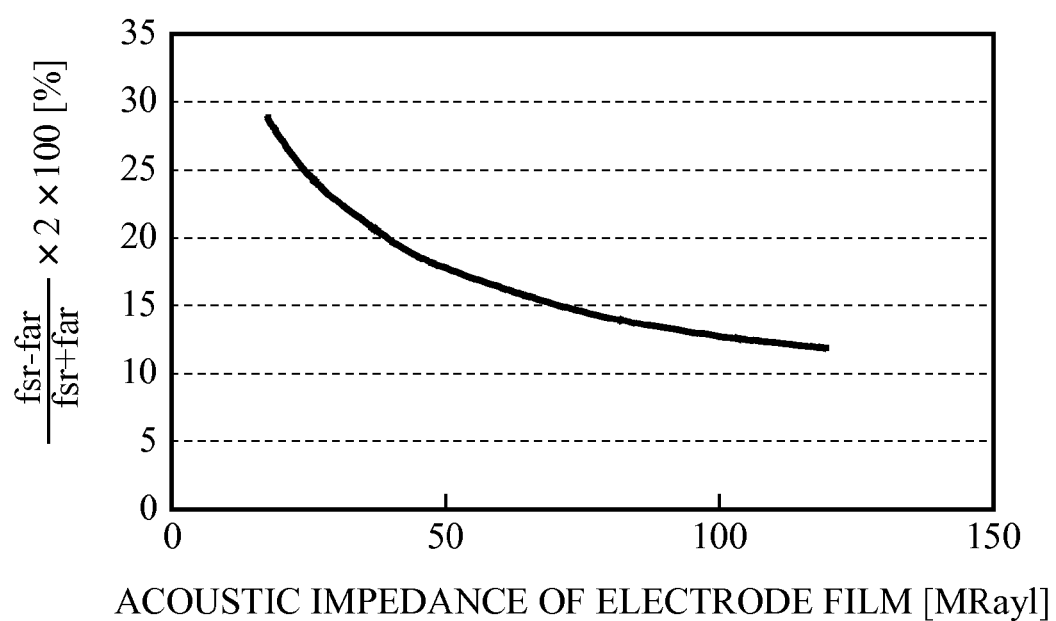
FIG. 19 is a graph of a spacing ratio between resonance frequencies associated with an acoustic impedance of an electrode film.

FIG. 18A is a graph of an impedance vs. frequency characteristic. FIG. 18B is a graph of a passband characteristic. FIG. 19 is a view of a resonance frequency spacing ratio associated with the acoustic impedance of the electrode film. In FIGS. 18A and 18B, alternate long and short dash lines indicate simulation results under conditions that the first lower electrode 12, the first upper electrode 16, the second lower electrode 22, and the second upper electrode 26 have an acoustic impedance of 109 Mrayl and are made of Ir (iridium). Solid lines indicate simulation results under conditions that the first lower electrode 12, the first upper electrode 16, the second lower electrode 22, and the second upper electrode 26 have an acoustic impedance of 82 Mrayl and are is made of W (tungsten). Broken lines indicate simulation results under conditions that the first lower electrode 12, the first upper electrode 16, the second lower electrode 22, and the second upper electrode 26 have an acoustic impedance of 58 Mrayl and are made of Mo (molybdenum). Dotted lines indicate simulation results under conditions that the first lower electrode 12, the first upper electrode 16, the second lower electrode 22, and the second upper electrode 26 have an acoustic impedance of 23 Mrayl and are made of Ti (titanium). When the acoustic impedance of the electrodes increases, the spacing between the resonance frequencies decreases as illustrated in FIGS. 18A and 19. When the acoustic impedance of the electrodes increases, the loss at the band center of the passband reduces as illustrated in FIG. 18B.

Particularly, as illustrated in FIG. 19, when the first lower electrode 12, the first upper electrode 16, the second lower electrode 22, and the second upper electrode 26 have an acoustic impedance of not less than 50 Mrayl, the spacing between resonance frequencies is saturated. The acoustic impedance of the electrodes is preferably not less than 60 Mrayl, and is more preferably not less than 70 Mrayl. Table 1 illustrates the acoustic impedances of metallic elements.

TABLE 1

| ELEMENT | Ir | W | Ru | Rh | Mo | Pt | Ta |
|---|---|---|---|---|---|---|---|
| ACOUSTIC IMPEDANCE(Mrayl) | 109 | 82 | 72 | 67 | 58 | 57 | 56 |

It will be seen from Table 1 that it is preferable to include at least one of Ir (iridium), W (tungsten), Ru (ruthenium), Rh (rhodium), Mo (molybdenum), Pt (platinum), and Ta (tantalum) in the first lower electrode 12, the first upper electrode 16, the second lower electrode 22, and the second upper electrode 26 in order to set the acoustic impedances of these electrodes equal to or higher than 50 Mrayl. It is preferable that each of the first lower electrode 12, the first upper electrode 16, the second lower electrode 22, and the second upper electrode 26 is an Ir film, a W film, a Ru film, a Rh film, a Mo film, a Pt film, or a Ta film. More preferably, Ir is employed in the first lower electrode 12, the first upper electrode 16, the second lower electrode 22, and the second upper electrode 26. Preferably, the first lower electrode 12, the first upper electrode 16, the second lower electrode 22, and the second upper electrode 26 have an acoustic impedance of not greater than 120 Mrayl, since Ir has the highest acoustic impedance.

Embodiment 4

Figure 20A:
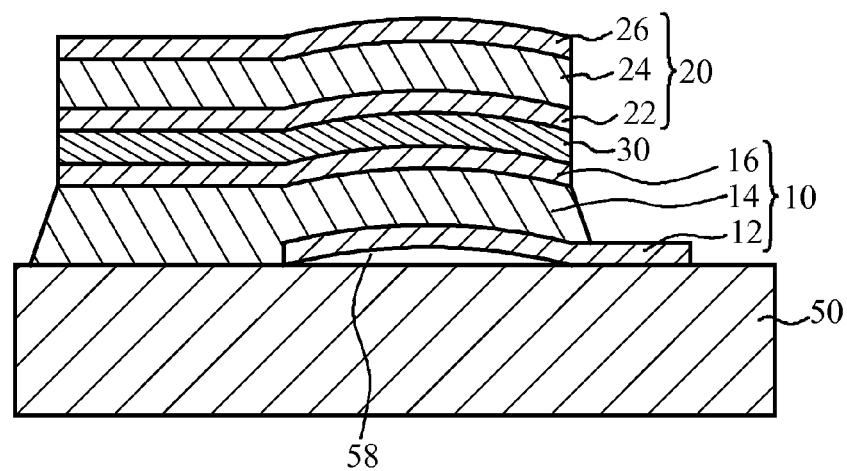
FIGS. 20A and 20B are sectional views of an acoustic wave device according to a embodiment 4.

An embodiment 4 has an exemplary structure is an example where the CRFs according to the embodiments 1 to 3 are each formed on the substrate. FIGS. 20A to 21B are sectional view of an acoustic wave device according to the embodiment 4. As illustrated in FIG. 20A, the first piezoelectric thin film resonator 10 and the second piezoelectric thin film resonator 20 are stacked on the substrate 50 so that the decoupler film 30 is interposed between the resonators 10 and 20. The substrate 50 may be made of silicon, glass, or sapphire. In the resonance area, the cavity 58 is formed between the first lower electrode 12 and the substrate 50. For example, the cavity 58 has a dome shape. Other components are the same as those illustrated in FIG. 6, and a description thereof is omitted here.

Figure 20B:
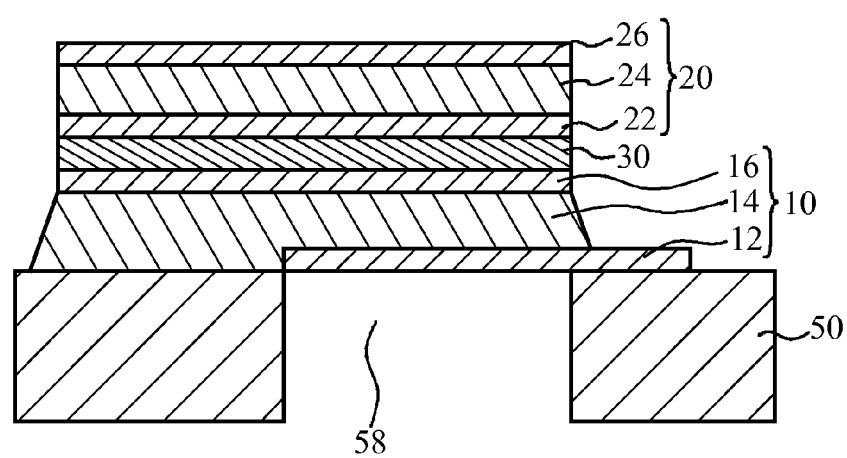
Figure 21A:
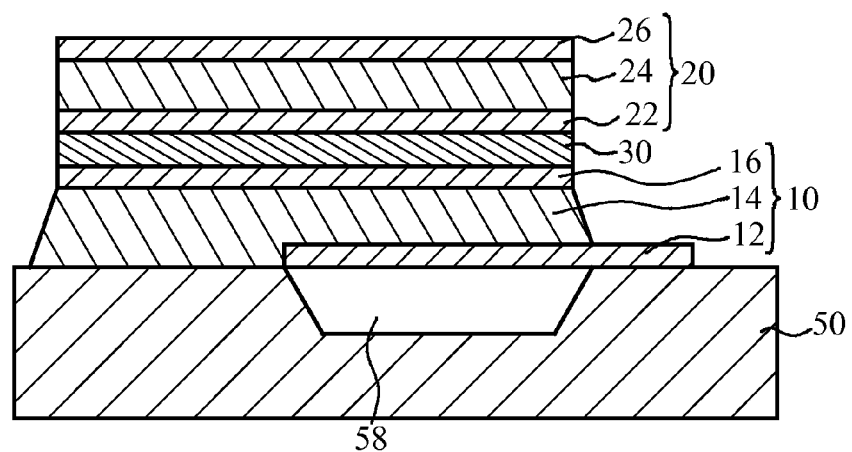
FIGS. 21A and 21B are sectional views of another acoustic wave according to the embodiment 4.
Figure 21B:
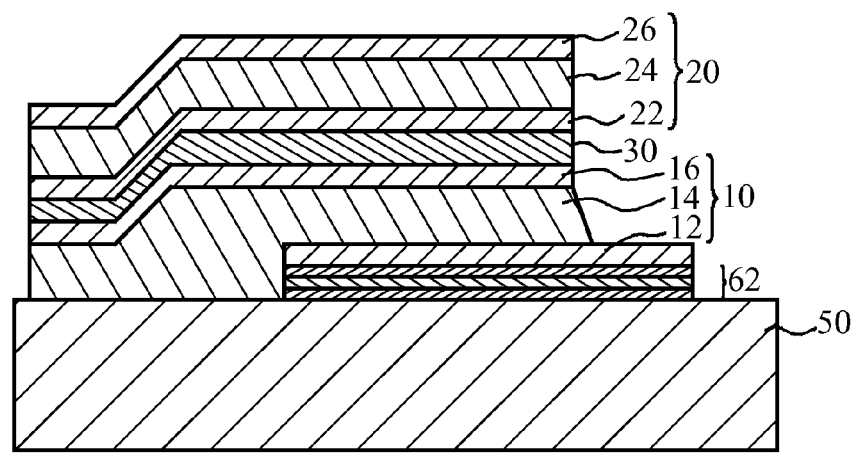

As illustrated in FIG. 20B, the substrate 50 has the cavity 58 penetrating therethrough in the resonance area. Other components are the same as those illustrated in FIG. 20A, and a explanation thereof is omitted here. As illustrated in FIG. 21A, the cavity 58 may be formed by a recess that is formed in an area according to the resonance area of the substrate 50. As illustrated in FIG. 21B, instead of the cavity 58, the acoustic reflection film 62 may be provided under the first lower electrode 12. The structure of the acoustic reflection film 62 is the same as the structure illustrated in FIG. 3, and a description thereof is omitted here.

In the embodiments 1 to 4, the decoupler film 30 may be a multilayer film as illustrated in FIG. 5 The decoupler film 30 of the multilayer film reduces the spacing between the resonance frequencies, and reduces the loss at the band center of the passband. In contrast, the decoupler film 30 of the single layered film may be formed easily. However, the spacing between resonance frequencies increases, and the loss at the band center of the passband increases. Therefore, when the decoupler film 30 is the single-layered film, it is preferable that the structure of one of the embodiments 1 to 4 is used to reduce the loss at the band center of the passband.

Also, as illustrated in FIGS. 7A to 8, the acoustic impedance of the decoupler film 30 that is not less than 5 Mrayl increases the spacing between the resonance frequencies and deteriorates the loss at the band center of the passband. In this case, it is preferable to employ one of the structures according to the embodiments 1 to 4. When the acoustic impedance of the decoupler film 30 is more than or equal to 7 Mrayl, it is preferable to employ one of the structures according to the embodiments 1 to 4. When the acoustic impedance of the decoupler film 30 is not less than 10 Mrayl, it is more preferable to employ one of the structures according to the embodiments 1 to 4.

When the decoupler film 30 includes silicon oxide, the spacing between resonance frequencies increases and the loss at the band center of the passband increases, as illustrated in FIGS. 7A and 8. Therefore, in this case, it is preferable to employ one of the structures of the embodiments 1 to 4. The decoupler film 30 may be the silicon oxide film or a film with silicon oxide added. For example, the silicon oxide film may include F (fluorine) for an improvement in temperature characteristics.

The embodiments of the present invention have been described. The present invention is not limited to these specific embodiments but may be varied or changed within the scope of the claimed invention.

What is claimed is:

1. An acoustic wave device comprising:
   a substrate;
   a first piezoelectric thin film resonator provided on the substrate and including a first lower electrode, a first upper electrode and a first piezoelectric film sandwiched between the first lower and upper electrodes;
   a decoupler film provided on the first upper electrode; and
   a second piezoelectric thin film resonator provided on the decoupler film and including a second lower electrode, a second upper electrode and a second piezoelectric film sandwiched between the second lower and upper electrodes,
   wherein the first piezoelectric film and the second piezoelectric film comprise aluminum nitride and include an element increasing a piezoelectric constant of the aluminum nitride, and
   wherein an amount of the element included in the first piezoelectric film is smaller than that of the element included in the second piezoelectric film.

2. The acoustic wave device of claim 1, wherein the element includes one of scandium and erbium.

3. An acoustic wave device comprising:
   a first piezoelectric thin film resonator including a first lower electrode, a first upper electrode and a first piezoelectric film sandwiched between the first lower and upper electrodes;
   a decoupler film provided on the first upper electrode; and
   a second piezoelectric thin film resonator provided on the decoupler film and including a second lower electrode, a second upper electrode and a second piezoelectric film sandwiched between the second lower and upper electrodes,
   wherein the first upper electrode and the second lower electrode have thicknesses different from those of the first lower electrode and the second upper electrode.

4. The acoustic wave device of claim 3, wherein the first upper electrode and the second lower electrode have thicknesses greater than those of the first lower electrode and the second upper electrode.

5. The acoustic wave device of claim 3, wherein the decoupler film is a single-layered film.

6. The acoustic wave device of claim 3, wherein the decoupler has an acoustic impedance higher than or equal to 5 Mrayl.

7. The acoustic wave device of claim 3, wherein the decoupler film includes silicon oxide.

8. The acoustic wave device of claim 3, wherein the first lower electrode, the first upper electrode, the second lower electrode, and the second upper electrode have acoustic impedances that are higher than or equal to 50 Mrayl and are lower than or equal to 120 Mrayl.

9. The acoustic wave device of claim 3, wherein each of the first lower electrode, the first upper electrode, the second lower electrode, and the second upper electrode includes at least one of Ir, W, Ru, Rh, Mo, Pt, and Ta.

10. The acoustic wave device of claim 3, further comprising a substrate provided so as to form a cavity between the first lower electrode and the substrate.

* * * * *